United States Patent
Hsiao et al.

(10) Patent No.: US 9,978,647 B2
(45) Date of Patent: May 22, 2018

(54) METHOD FOR PREVENTING DISHING DURING THE MANUFACTURE OF SEMICONDUCTOR DEVICES

(71) Applicant: UNITED MICROELECTRONICS CORP., Hsinchu (TW)

(72) Inventors: Shih-Yin Hsiao, Chiayi County (TW); Kuan-Liang Liu, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days. days.

(21) Appl. No.: 14/980,779

(22) Filed: Dec. 28, 2015

(65) Prior Publication Data

US 2017/0186652 A1 Jun. 29, 2017

(51) Int. Cl.
| | | |
|---|---|---|
| H01L 21/8234 | (2006.01) |
| H01L 29/40 | (2006.01) |
| H01L 21/311 | (2006.01) |
| H01L 21/3105 | (2006.01) |
| H01L 21/02 | (2006.01) |
| H01L 27/088 | (2006.01) |
| H01L 29/49 | (2006.01) |

(52) U.S. Cl.
CPC .. *H01L 21/823481* (2013.01); *H01L 21/0217* (2013.01); *H01L 21/31053* (2013.01); *H01L 21/31105* (2013.01); *H01L 27/088* (2013.01); *H01L 29/401* (2013.01); *H01L 29/4966* (2013.01)

(58) Field of Classification Search
CPC ......... H01L 21/823481; H01L 21/0217; H01L 21/31053; H01L 21/31105; H01L 27/088; H01L 29/4916
See application file for complete search history.

(56) References Cited

U.S. PATENT DOCUMENTS

| | | | |
|---|---|---|---|
| 9,397,003 B1* | 7/2016 | Niimi | H01L 21/823418 |
| 2005/0127460 A1* | 6/2005 | Saito | H01L 21/28079 |
| | | | 257/412 |
| 2011/0248334 A1* | 10/2011 | Sandhu | H01L 27/11551 |
| | | | 257/326 |
| 2012/0190201 A1* | 7/2012 | Park | C09G 1/02 |
| | | | 438/693 |
| 2015/0147872 A1* | 5/2015 | Leong | H01L 21/02532 |
| | | | 438/488 |

\* cited by examiner

*Primary Examiner* — Brigitte Paterson
(74) *Attorney, Agent, or Firm* — WPAT, PC (57) ABSTRACT

A method for manufacturing a semiconductor device and a device manufactured using the same are provided. According to a method approach of the embodiment, a substrate having at least a first area with a plurality of polysilicon gates and a second area adjacent to the first area is provided. A contact etch stop layer (CESL) over the polysilicon gates of the first area is formed, and the CESL extends to the second area. Then, a dielectric layer is formed on the CESL, and a nitride layer is formed on the dielectric layer. The nitride layer is patterned to expose the dielectric layer in the first area and to form a pattern of dummy nitrides on the dielectric layer in the second area.

15 Claims, 9 Drawing Sheets

METHOD FOR PREVENTING DISHING DURING THE MANUFACTURE OF SEMICONDUCTOR DEVICES

BACKGROUND

Technical Field

The disclosure relates in general to a method for manufacturing a semiconductor device and the semiconductor device manufactured using the same, and more particularly to a method for manufacturing a semiconductor device using a dummy stop layer, thereby improving the electrical characteristics of the semiconductor device.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages, which have considerable effects on the electrical properties, would be one of the important issues of the device for the manufacturers. Generally, a semiconductor device with good electrical performance requires the elements such as the gates and the related layers with excellent properties, such as complete profiles of the components/layers and no unwanted residues remained in the device.

Figure 1A:
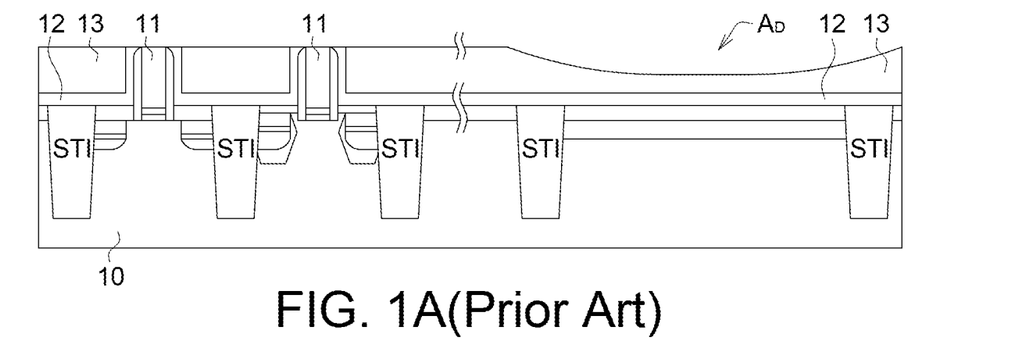
FIG. 1A (prior art)-FIG. 1B (prior art) illustrate a conventional method for planarizing the dielectric layers of a semiconductor device and forming the metal gates.
Figure 1B:
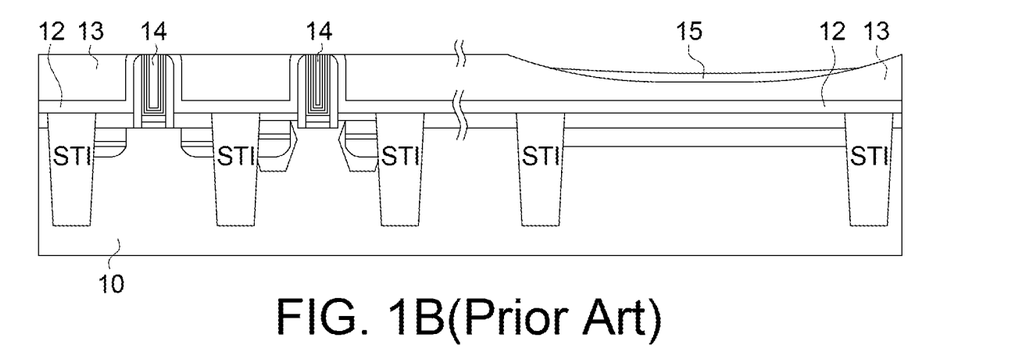

The current nitride planarization process, such as the step of planarizing the contact etch stop layer (CESL) by chemical mechanical polishing (CMP) in the RMG (replacement metal gate) process, generally suffers from over-polishing (or erosion) in an area without or with few poly gate structures. FIG. 1A-FIG. 1B illustrate a conventional method for planarizing the dielectric layers of a semiconductor device and forming the metal gates. After planarizing the dielectric layers such as the oxide layer 13 (i.e. the inter-layered dielectric, ILD) on the CESL 12 and the top portion of the CESL 12 (ex: typically using silicon nitride (SiN) as the material of the CESL on the poly-gate 11) by CMP, the dishing of the oxide layer 13 (i.e. generally referred as the "SiN-CMP problem") would be occurred in the conventional fabrication of the semiconductor device especially in a large area without or only few poly gate structures, as shown in FIG. 1A. This dishing area $A_D$ is a profile defect. After metal deposition and removal (such as by CMP) for replacing the poly gates 11 to form the metal gates 14, the unwanted metal residue 15 would be remained in the dishing area $A_D$, as shown in FIG. 1B.

It is known that the structure a dishing profile (such as dishing of ILD, FIG. 1A) and unwanted metal residue remained in the dishing area (FIG. 1B) generated in the conventional manufacturing method will cause short circuit problem on following metal interconnection process. Accordingly, it is desired to develop a method for forming a complete profile of the elements (such as the gates and dielectric layers) without defects of dishing and residues remained, and the electrical performance of the device still satisfy the product requirements.

SUMMARY

The disclosure is directed to a method for manufacturing a semiconductor device and device manufactured using the same, which use a nitride pattern as a dummy stop layer for obtaining complete profiles of the element and preventing unwanted metal residues remained in the device, thereby improving the electrical performance of the semiconductor device.

According to the disclosure, a method for manufacturing a semiconductor device is provided. A substrate having at least a first area with a plurality of polysilicon gates and a second area adjacent to the first area is provided. A contact etch stop layer (CESL) over the polysilicon gates of the first area is formed, and the CESL extends to the second area. Then, a dielectric layer is formed on the CESL, and a nitride layer is formed on the dielectric layer. The nitride layer is patterned to expose the dielectric layer in the first area and to form a pattern of dummy nitrides on the dielectric layer in the second area.

According to the disclosure, a semiconductor device is provided, comprising a substrate having at least a first area with a plurality of metal gates and a second area adjacent to the first area; a patterned contact etch stop layer (CESL) formed in the first area and the second area; a patterned dielectric layer formed on the patterned CESL, wherein the adjacent metal gates are separated by the patterned CESL and the patterned dielectric layer; and a pattern comprising patterned underlying nitrides embedded in the patterned dielectric layer within the second area, wherein the pattern comprising the patterned underlying nitrides is separated from the patterned CESL by the patterned dielectric layer.

DETAILED DESCRIPTION

In the present disclosure, a method for manufacturing a semiconductor device is provided. According to the embodiments, a pattern of dummy nitrides is conducted in the manufacturing process, such as formed in an area without or only few poly gate structures, thereby successfully preventing the conventional over-polishing issues (such as the SiN-CMP problem generally occurred in the conventional fabrication of the semiconductor device as described in the background) such as dishing of ILD and unwanted metal residue remained in the dishing area. Accordingly, the unwanted metal residues issue can be solved and the production yield can also be significantly increased. Moreover, the electrical performance of the semiconductor device of the embodiment, such as capacities, would not be affected by the dummy nitrides of the invention.

The present disclosure could be applied to a semiconductor device having the areas with different poly gate densities. The manufacturing methods of the embodiments would be slightly different, and could be modified and changed according to the procedures in practical applications. According to the following embodiments of the disclosure, the replacement metal gate (RMG) processes are taken for exemplifications. Three embodiments are provided hereinafter with reference to the accompanying drawings for describing the related procedures and configurations, but the present disclosure is not limited thereto. It is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

<First Embodiment>

Figure 2A:
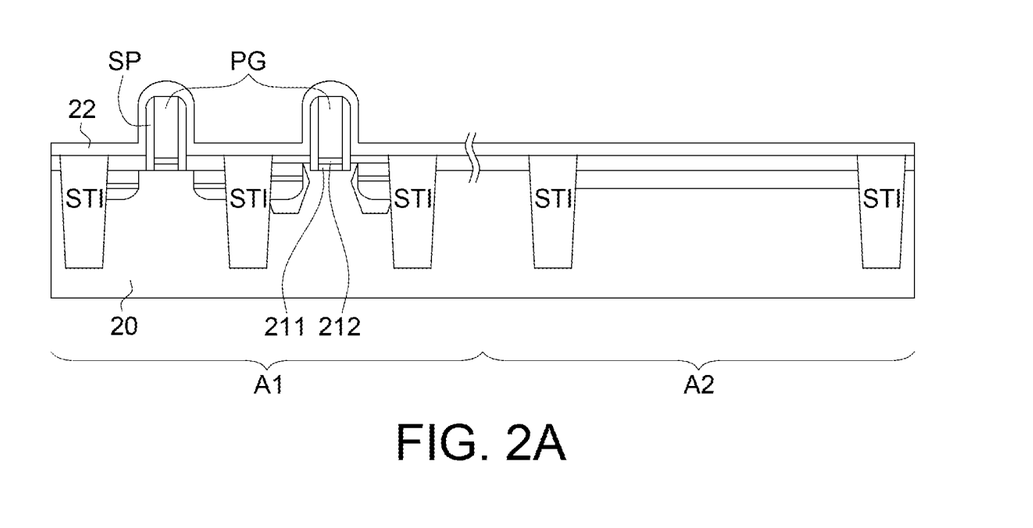
FIG. 2A-FIG. 2H illustrate a method for manufacturing a semiconductor device according to the first embodiment of the present disclosure.

FIG. 2A-FIG. 2H illustrate a method for manufacturing a semiconductor device according to the first embodiment of the present disclosure. First, a substrate 20 (such as a silicon substrata) having at least a first area A1 with a plurality of polysilicon gates (can be abbreviated as "poly gates") PG and a second area A2 adjacent to the first area A1 is provided, as shown in FIG. 2A. According to one embodiment, the first area A1 is an area with the n-channel field effect transistor (NFET) and p-channel field effect transistor (PFET) formed thereon, but the disclosure is not limited thereto. Also, the substrate 20 can be divided into the areas with high density of the gate structures to be processed, and the other areas with low density of the gate structures (even zero gate structure) to be processed. According to the embodiment, the first area A1 can be an area with high density of the gate structures (which can be denoted as "a high poly density area"), while the second area A2 can be an area with few gate structures or no gate structure which can be denoted as "a low/zero poly density area"). In the practical application, the second area is an area in which the particular elements such as capacitors, resistors or other elements, or the high-voltage (HV) devices can be formed. However, the disclosure is not limited thereto.

In one embodiment, the substrate 20 includes the shallow trench isolations (STIs), the sources S and the drains D. In one embodiment, each of the poly gates PG includes, but not limited to, a gate insulating layer 211 (such as a high K dielectric layer or an multi-layer insulation), a bottom barrier metal (BBM) 212 formed on the gate insulating layer 211, and a polysilicon formed on the bottom barrier metal (BBM) 212 to form a dummy poly gate PG in the RMG processes. Also, the spacers SP are formed on the sidewalls of the poly gate PG, the bottom barrier metal 212 and the gate insulating layer 211. Also, a contact etch stop layer (CESL) 22 is formed over the poly gates PG of the first area A1, and the CESL 22 extends to the second area A2.

Material examples of a high-k dielectric layer as the gate insulating layer 211 include, but are not limited to, hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and other suitable materials. The bottom barrier metal 212, functioning as a buffering layer for the high-k dielectric layer and the polysilicon layer (formed later), and material examples of the bottom barrier metal 212 include, but are not limited to, TiN and other suitable materials.

Figure 2B:
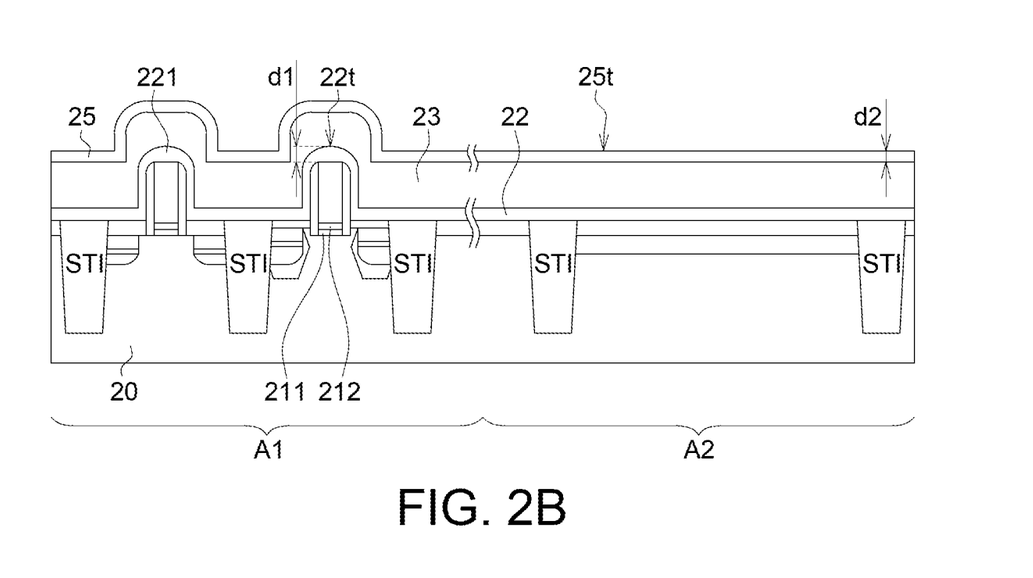

Next, a dielectric layer 23 is formed on the CESL 22, and a nitride layer 25 is formed on the dielectric layer 23, as shown in FIG. 2B. In the first embodiment, a single oxide layer is adopted as the dielectric layer 23 for exemplification. Also, the nitride layer 25 could be silicon nitride (SiN), or other material containing nitride as the CESL layer. According to one embodiment, a top surface $25t$ of the nitride layer 25 is substantially aligned with a top surface $22t$ of the CESL 22 above the poly gate PG. Also, a thickness d2 of the nitride layer 25 is substantially equal to a thickness d1 of the CESL 22 (i.e. substantially equal to a thickness of the top portion 221 of the CESL 22 on the polysilicon gates). The nitride layer 25 has a uniform thickness d2, as shown in FIG. 2B. In one embodiment, the dielectric layer 23 is an oxide layer with a thickness of about 350 Å, and the CESL 22 is a silicon nitride (SiN) layer with a thickness of about 230 Å, wherein the poly gate PG has a height of about 580 Å.

Figure 2C:
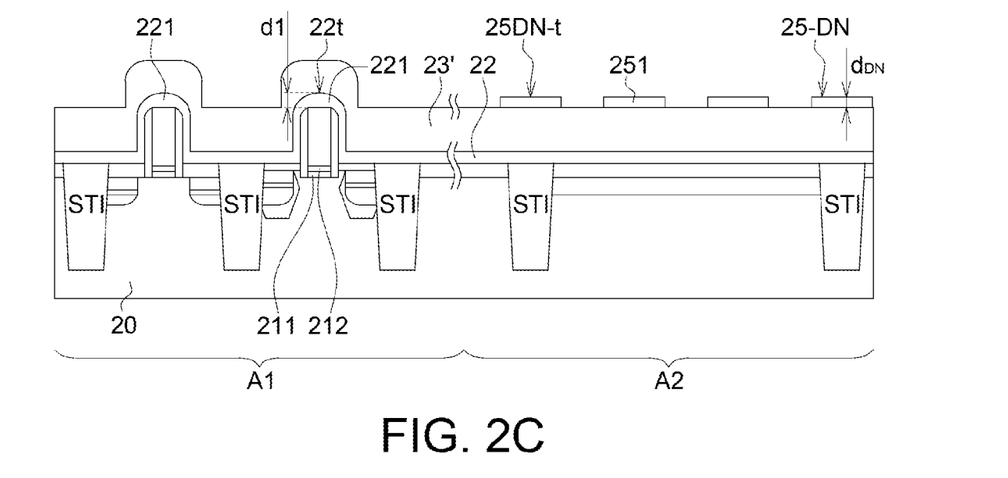

Afterward, the nitride layer 25 is patterned to expose the dielectric layer 23' in the first area A1 and form a pattern of dummy nitrides 25-DN on the dielectric layer 23' in the second area A2, as shown in FIG. 2C. In the first embodiment, the nitride layer 25 in the first area A1 is completely removed to expose the dielectric layer 23', but the poly gates PG are still covered by the dielectric layer 23'. In one embodiment, a top surface 25DN-t of the pattern of dummy nitrides 25-DN is substantially aligned with the top surface $22t$ of the CESL 22 above the poly gates PG. In one embodiment, a thickness $d_{DN}$ of the pattern of dummy nitrides 25-DN is substantially equal to a thickness d1 of the top portion 221 of the CESL 22 on the poly gates PG. Also, the pattern of dummy nitrides 25-DN has a uniform thickness according to the embodiment. As shown in FIG. 2C, the pattern of dummy nitrides 25-DN has a planarized top surface 25DN-t substantially parallel to the substrate 20.

Figure 2D:
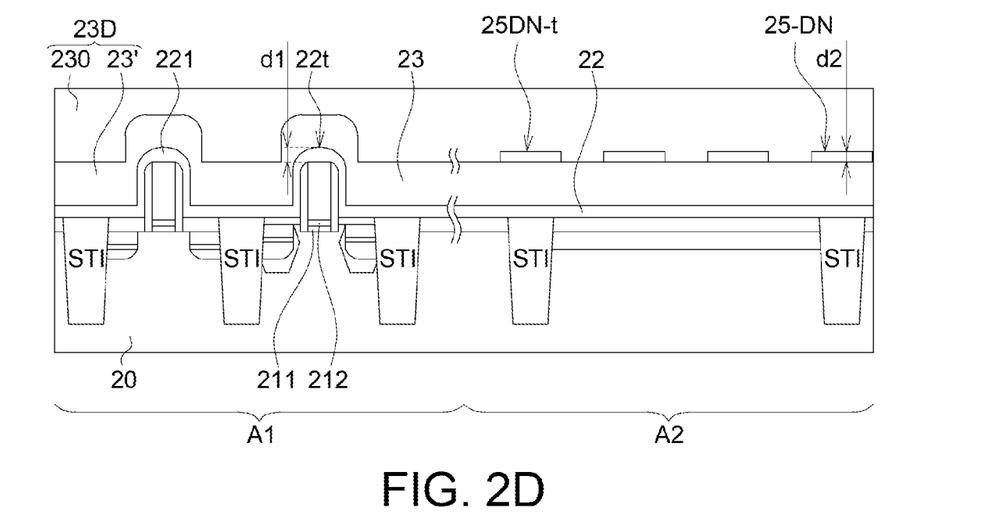

Subsequently, another dielectric deposition 230 is formed on the dielectric layer 23', wherein the pattern of dummy nitrides 25-DN is encapsulated in the dielectric deposition 230 and the dielectric layer 23', as shown in FIG. 2D. In one embodiment, the material of the dielectric deposition 230 can be the same as the material of the dielectric layer 23/23'. The dielectric deposition 230 and the dielectric layer 23' can be referred as a dielectric combination 23D for describing the following steps.

Figure 2E:
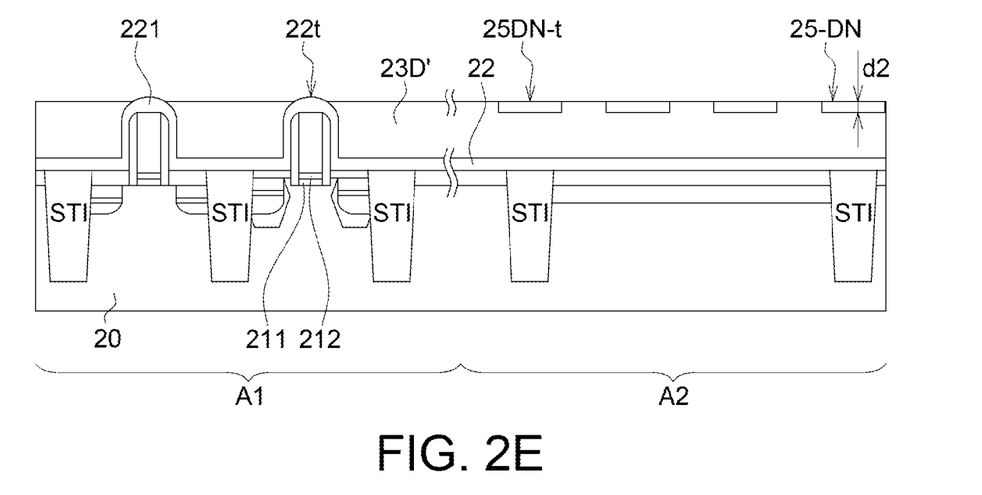

After encapsulating the pattern of dummy nitrides 25-DN, the dielectric deposition 230 and the dielectric layer 23' (or the dielectric combination 23D) are planarized until the top surface 25DN-t of the pattern of dummy nitrides 25-DN being exposed (so as to form the patterned dielectric combination 23D'), as shown in FIG. 2E. According to an embodiment, the top portions 221 of the CESL 22 on the poly gates PG are also exposed. In one embodiment, the pattern of dummy nitrides 25-DN is disposed correspondingly to a horizontal position between the poly gates PG and the top surface $22t$ of the CESL 22 above the poly gates PG.

Figure 2F:
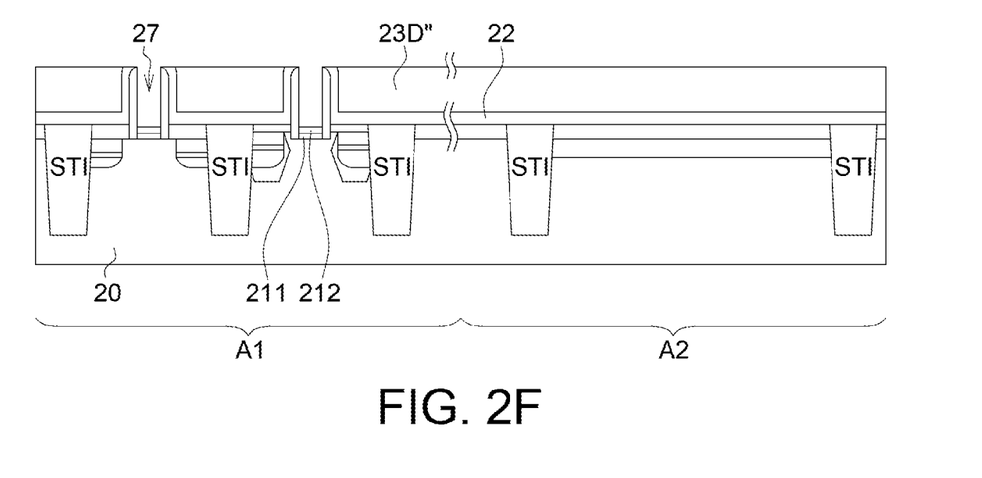

After exposing the pattern of dummy nitrides 25-DN in the second area A2 and exposing the top portions 221 of the CESL 22 in the first area A1, the pattern of dummy nitrides 25-DN and the top portions 221 of the CESL 22 above the poly gates PG are removed to expose the poly gates PG, followed by removing the poly gates PG to form plural gate trenches 27, as shown in FIG. 2F.

Figure 2G:
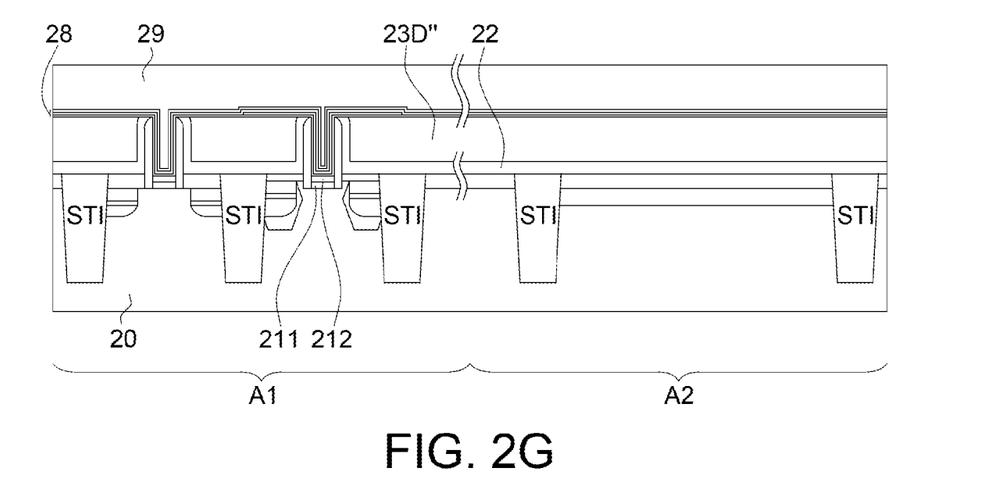
Figure 2H:
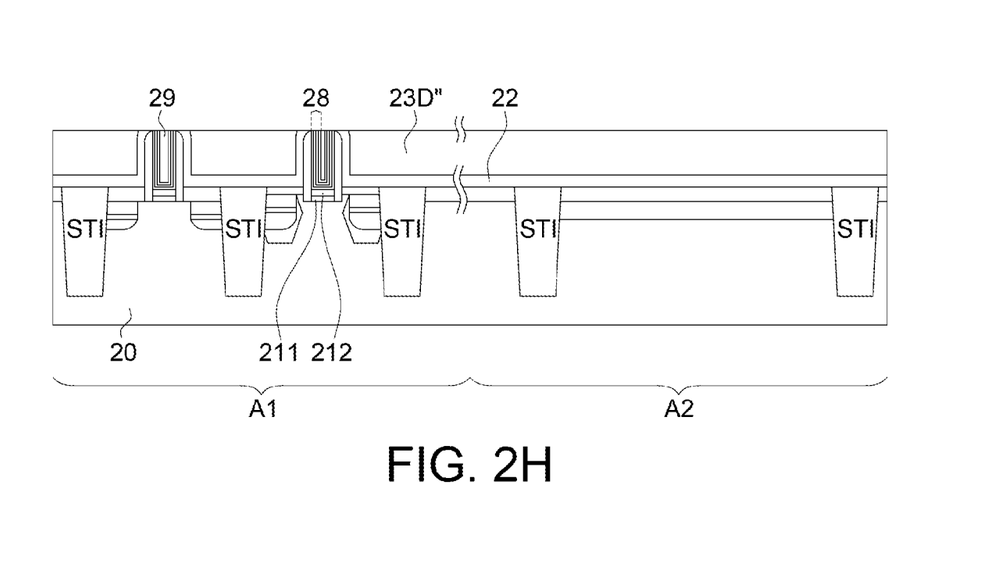

Then, metal gate filling and formation are performed. As shown in FIG. 2G, the multiple conductive layers, such as a work function metal layer 28 and a conductor 29 (such as Al or W or other suitable conductive materials) are formed to fill the gate trenches 27. Afterward, the multiple conductive layers are planarized such as by CMP, as shown in FIG. 2H, so as to complete the replacement of the poly gates PG with the metal gates. In one embodiment, the work function metal layer 28 can be a single metal layer or a multiple-metal layer.

Materials of the work function metal layer 28 and the conductor 29 could be, but not limited to, the work function metals suitable for adjusting the work functions of N/P-type transistors, and the metals with low resistance. In one embodiment, materials of the work function metal layer 28 could be, but are not limited to, the work function metals include TiN, TaN, titanium carbide (TiC), tantalum carbide (TaC), tungsten carbide (WC), or aluminum titanium nitride (TiAlN), titanium aluminide (TiAl), zirconium aluminide (ZrAl), tungsten aluminide (WAl), tantalum aluminide (TaAl), or hafnium aluminide (HfAl), or other suitable materials. Material examples of the conductor 29 with low resistance include Al, W and other suitable materials. The work function metal layer 28 could be in form of a U-shaped film conformal to the gate trench 27, and the remaining space of the gate trench 27 could be filled with the conductor 29 with low resistance.

According to the aforementioned manufacturing method of the embodiment, a pattern of dummy nitrides 25-DN (such as SiN, or containing nitride as the material of the CESL 22) can be formed in the second area A2 (i.e. a low/zero poly density area), while the first area A1 is a high poly density area comprising such as plural poly gates PG. During removal of the top portion 221 of the CESL 22 by CMP, the pattern of dummy nitrides 25-DN acts as a stopper in the low/zero poly density area. After removing the top portion 221 of the CESL 22 and the pattern of dummy nitrides 25-DN, no dishing defect occurs in the low/zero poly density area (ex: in a large diffusion area) after SiN CMP step, thereby controlling the profile. Thus, the electrical characteristics of the semiconductor device of the embodiment can be significantly improved.

Figure 3A:
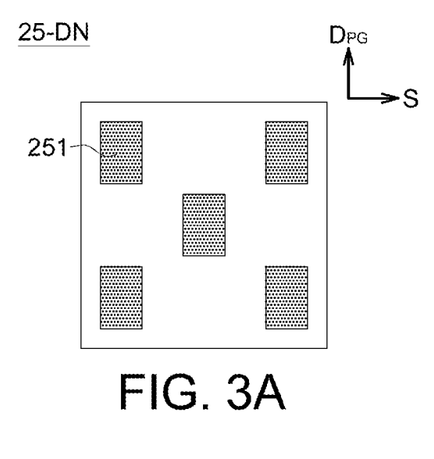
FIG. 3A-FIG. 3E are simple drawings of the top views of some applicable patterns of dummy nitride.
Figure 3B:
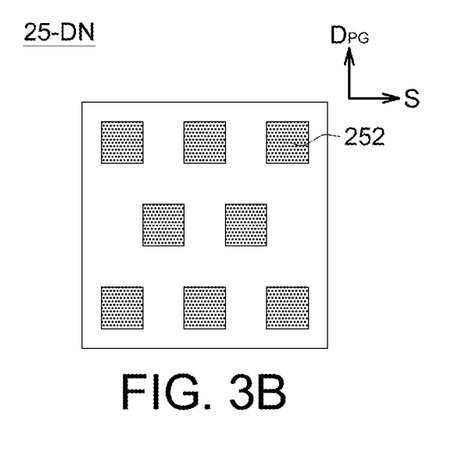
Figure 3C:
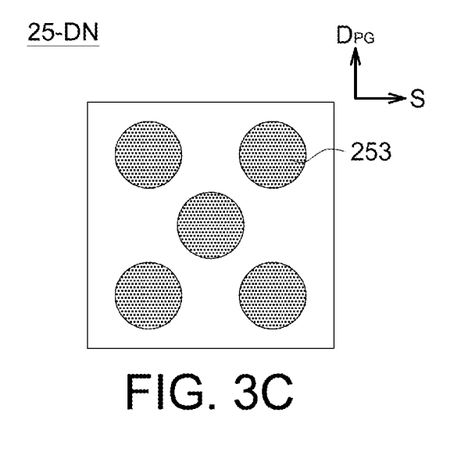
Figure 3D:
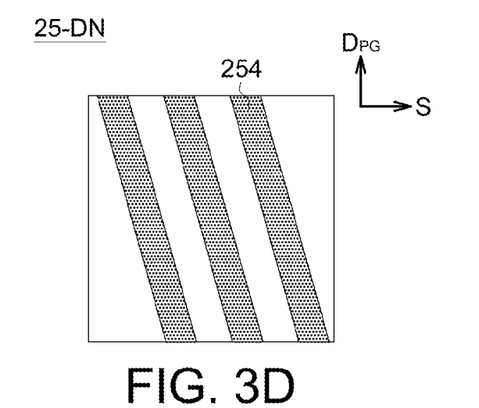
Figure 3E:
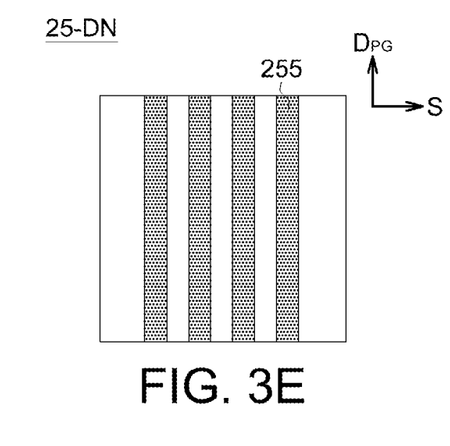

Additionally, many different possible patterns of dummy nitride can be applied in the practical applications. It can be understood that the pattern of dummy nitrides 25-DN of the embodiment is varied and adjusted depending on the design conditions and requirements of the practical application. The disclosure has no particular limitation thereto. FIG. 3A to FIG. 3E are simple drawings of the top views of some applicable patterns of dummy nitride. In FIG. 3A, the pattern of dummy nitrides 25-DN is a pattern comprising plural discrete rectangular nitride blocks 251. In FIG. 3B, the pattern of dummy nitrides 25-DN is a pattern comprising plural discrete squire nitride blocks 252. In FIG. 3C, the pattern of dummy nitrides 25-DN is a pattern comprising plural discrete circular nitride blocks 253. In FIG. 3D, the pattern of dummy nitrides 25-DN is a pattern comprising plural discrete stripes 254, which are slanted to the extending direction $D_{PG}$ of the poly gates PG. In FIG. 3E, the pattern of dummy nitrides 25-DN is a pattern comprising plural discrete stripes 255, which are parallel to the extending direction $D_{PG}$ of the poly gates PG.

Also, a pattern of dummy polysilicon formed in a low/zero poly density area has been investigated and tested as a comparison of the present disclosure. According to the results, the pattern of dummy poly may solve the SiN-CMP problem, but have considerable effect on the electrical characteristics of the semiconductor device, such as variation of capacities. For example, the electrical performance of the device may not having been satisfied with the requirements due to the variation of the capacities of the circuit (such as the RF circuit). In a RF (radio frequency) circuit simulation, a substrate having STIs is provided, wherein a CESL formed on the substrate, an oxide layer with a uniform thickness formed on the CESL, and a metal layer formed on the oxide layer are also constructed. According to a set of simulation data, a capacity between the CESL and the metal layer without dummy poly therebetween (only with oxide therebetween) is 0.21 $fF/um^2$, and a capacity between the dummy poly and the metal layer is 0.32 $fF/um^2$. A capacity between the metal layer and the bottom of the STI without dummy poly therebetween (only with CESL and oxide therebetween) is 0.075 $fF/um^2$, and a capacity between the metal layer and the dummy poly sit on the STI is 0.086 $fF/um^2$. Accordingly, the RF circuit is sensitive to metal routing, and dummy poly will increase RF capacity about 52% over the diffusion region and about 15% over the STIs. Thus, the dummy nitride design (acting as a stopper in the low/zero poly density area) of the embodiment possesses several advantages, and not only solving the dishing problem but also leading no variation of electrical properties (such as capacity over the diffusion region) of the device.

<Second Embodiment>

FIG. 4A-FIG. 4D illustrate a method for manufacturing a semiconductor device according to the second embodiment of the present disclosure. The process of second embodiment is similar to the process of the first embodiment, except for the dielectric layer being a multi-layer. In the first embodiment, a process flow of forming dummy nitrides on a single oxide layer is exemplified. In the second embodiment, a process flow of forming dummy nitrides on a multi-layer is exemplified. In the second embodiments, the same elements as that in the first embodiment, such as the substrate 20, the first area A1, poly gates PG, the second area A2, the gate insulating layer 211, the bottom barrier metal 212, the CESL 22, the nitride layer 25, the pattern of dummy nitrides 25-DN, . . . etc, are not redundantly described here.

Figure 4A:
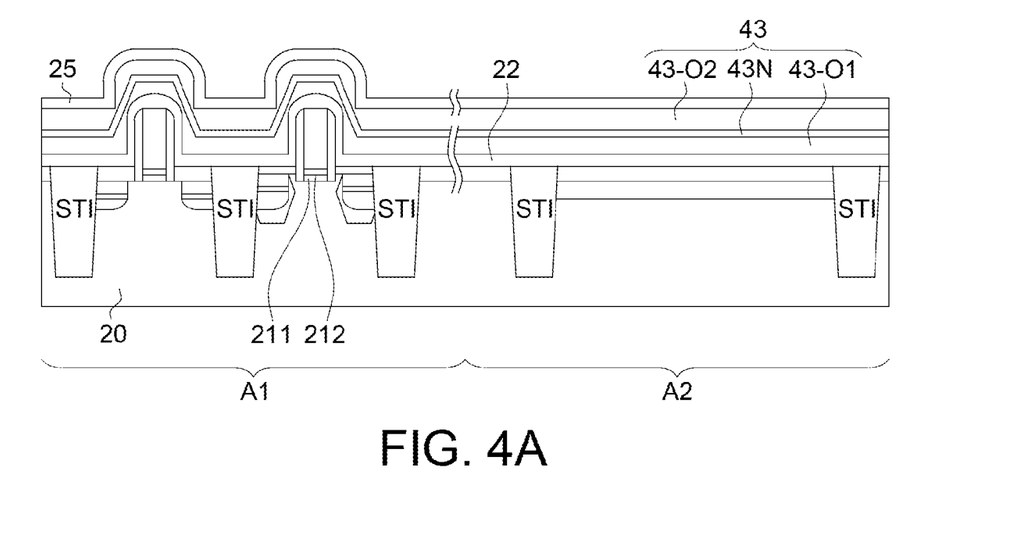
FIG. 4A-FIG. 4D illustrate a method for manufacturing a semiconductor device according to the second embodiment of the present disclosure.
Figure 4B:
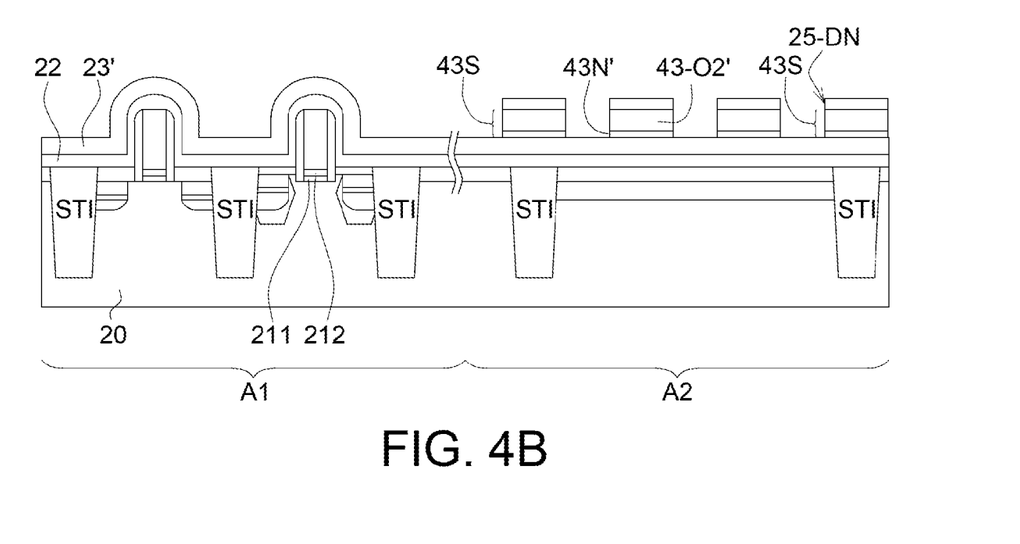

In the second embodiment, the dielectric layer 43 is a multi-layer, comprising a first oxide layer 43-O1 formed on the CESL 22, an underlying nitride layer 43N formed on the first oxide layer 431, and a second oxide layer 43-O2 formed on the underlying nitride layer 43N. The nitride layer 25 is formed on the second oxide layer 43-O2 of the multi-layer 43, as shown in FIG. 4A. Also, the thickness of the underlying nitride layer 43N can be equal to or smaller than the thickness of the nitride layer 25.

After forming the pattern of dummy nitrides 25-DN (can be performed by the step of FIG. 2C), the multi-layer 43 can be further defined (ex. Wet etching by the same mask for forming the pattern of dummy nitrides) to form plural multi-layer stacks 43S in the second area A2 according to the pattern of dummy nitrides 25-DN, as shown in FIG. 4A. So far, each multi-layer stack 43S under the pattern of dummy nitrides 25-DN comprises a patterned underlying nitride 43N' and a patterned second oxide 43-O2'. Meanwhile, the nitride layer 25, the second oxide layer 43-O2 and the underlying nitride layer 43-N in the first area A1 are completely removed.

Figure 4C:
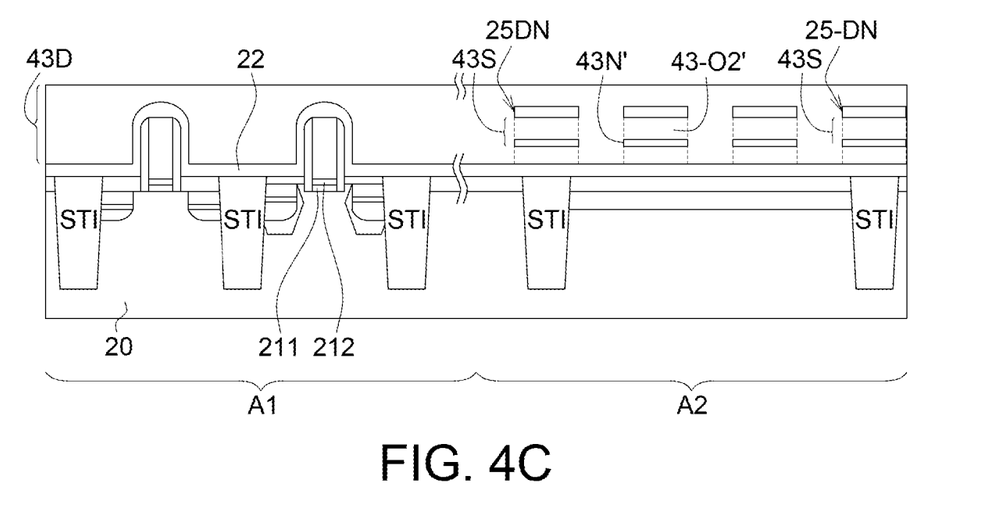

After defining the multi-layer 43, another dielectric deposition is formed on the dielectric layer 23' to cover the pattern of dummy nitrides 25-DN and the multi-layer stacks 43S (similar to the step of FIG. 2D), as shown in FIG. 4C. In one embodiment, the dielectric layer 23' and the dielectric deposition formed thereon comprise the same material, and can be referred as a dielectric combination 43D for describing the following steps. Afterward, several steps are conducted; for example, the dielectric combination 43D are planarized until a top surface of the pattern of dummy nitrides 25-DN being exposed (similar to the step of FIG. 2E); the pattern of dummy nitrides 25-DN and a top portion of the CESL above the poly gates PG are removed, so as to expose the poly gates PG in the first area A1 (similar to the step of FIG. 2F); and the poly gates PG are replaced with metal gates (similar to the steps of FIG. 2G and FIG. 2H).

Please refer to the first embodiment for the related steps, and those contents are not redundantly described here.

Figure 4D:
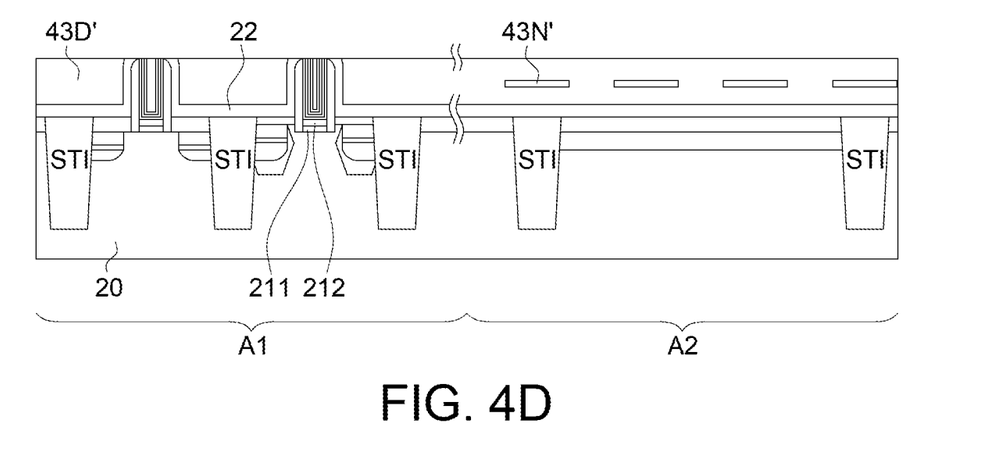

Please refer to FIG. 4D, which shows one of the completed structures of the second embodiment. In FIG. 4D, a pattern of patterned underlying nitrides 43N' is formed in the second area A2, wherein the pattern of patterned underlying nitrides 43N' is substantially parallel to the substrate 20 and can be identical to the pattern of dummy nitrides 25-DN. In one embodiment, the pattern of patterned underlying nitrides 43N' has a uniform thickness.

<Third Embodiment>

Figure 5A:
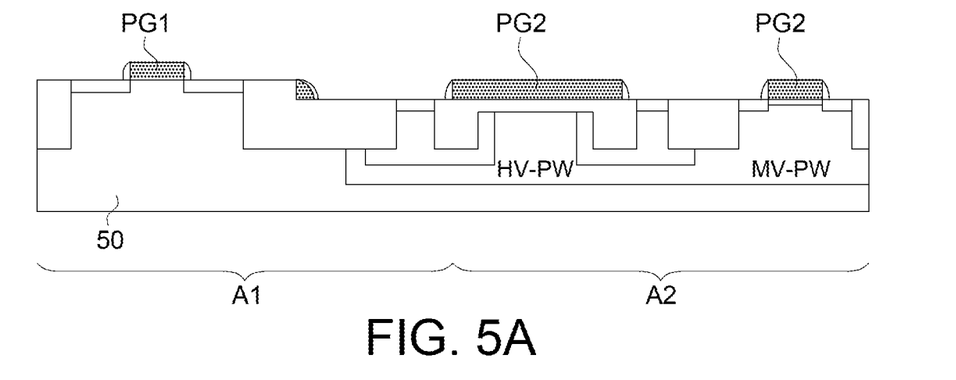
FIG. 5A and FIG. 5B illustrate a method for manufacturing a semiconductor device according to the third embodiment of the present disclosure.
Figure 5B:
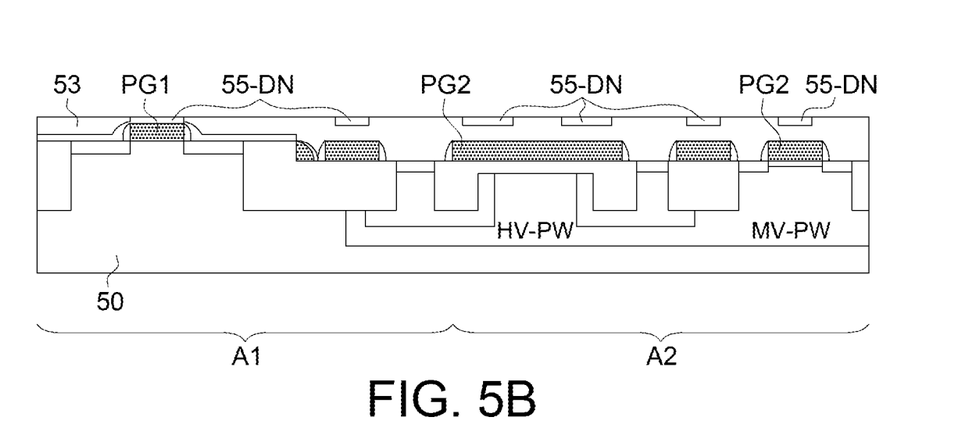

The dummy nitride design of the present disclosure can be applied to other type of the semiconductor device. In the third embodiment, a gate last embedded HV (high-voltage) process is exemplified for illustration. Please refer to FIG. 5A and FIG. 5B, which illustrate a method for manufacturing a semiconductor device according to the third embodiment of the present disclosure. In the third embodiment, a substrate 50 with a first area A1 and a second area A2 is provided, wherein the first area A1 comprises at least one first poly gate PG1, and the second area A2 comprises at least one embedded second poly gate PG2 gate. As shown in FIG. 5A, two poly gates PG2 (one is positioned within the HV-PW and the other is within the MV-PW) are depicted for illustration. Also, a top of the first poly gate PG1 is higher than a top of the second poly gates PG2. According to the third embodiment, the second area A2 is a HV-region with larger area, and the pattern of dummy nitrides 55-DN can be formed above those polysilicon gates in the HV-region, as shown in FIG. 5B, by adopting the steps (ex: forming an oxide layer to provide a planarizing surface above those polysilicon gates, followed by forming the pattern of dummy nitrides 55-DN) similar to the processes in the first and second embodiments, thereby solving the conventional SIN-CMP problem and preventing the dishing defect occurred in the device.

According to the aforementioned descriptions, the provided methods for manufacturing the semiconductor device of the embodiments adopt a pattern of dummy nitrides. The embodiments successfully prevent the conventional SiN-CMP problem of dishing of ILD and unwanted metal residue remained in the dishing area, thereby obtaining good electrical characteristics of the semiconductor device in the application consequently. Thus, the electrical characteristics of the semiconductor device are significantly improved and the production yield can also be increased. Moreover, for the application of the sensitive semiconductor device, the electrical performance (such as capacities) would not be affected by the dummy nitrides of the disclosure.

Other embodiments with different configurations of contacts, gates, (source and drain) are also applicable, which could be varied depending on the actual needs of the applications. It is, of course, noted that the configurations of figures are depicted only for demonstration, not for limitation. It is known by people skilled in the art that the shapes or positional relationship of the constituting elements could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor device, comprising:
providing a substrate having at least a first area with a plurality of polysilicon gates and a second area adjacent to the first area; forming a contact etch stop layer (CESL) over the plurality of polysilicon gates of the first area, and the CESL extending to the second area; forming a dielectric layer on the CESL; forming a nitride layer on the dielectric layer; and patterning the nitride layer to expose the dielectric layer in the first area and to form a pattern of dummy nitrides on the dielectric layer in the second area, wherein a top surface of the pattern of dummy nitrides is aligned with a top surface of the CESL above the plurality of polysilicon gates; and after forming the pattern of dummy nitrides, forming another dielectric deposition on the dielectric layer to cover a top surface and side surfaces of the pattern of dummy nitrides, wherein the pattern of dummy nitrides is completely encapsulated in said another dielectric deposition and the dielectric layer.

2. The method according to claim 1, wherein a thickness of the pattern of dummy nitrides is equal to a thickness of the CESL.

3. The method according to claim 1, wherein the pattern of dummy nitrides has a uniform thickness.

4. The method according to claim 1, wherein the top surface of the pattern of dummy nitrides is planarized and parallel to the substrate.

5. The method according to claim 1, wherein the pattern of dummy nitrides is a pattern comprising plural discrete nitride stripes, plural discrete circular nitride blocks, plural discrete rectangular nitride blocks or plural discrete square nitride blocks, or a net-like nitride pattern.

6. The method according to claim 1, wherein the CESL comprises nitride and the dielectric layer comprises oxide.

7. The method according to claim 1, wherein after patterning the nitride layer, the nitride layer in the first area is completely removed to expose the dielectric layer, wherein the plurality of polysilicon gates are covered by the dielectric layer.

8. The method according to claim 1, after forming said another dielectric deposition, the method further comprising: planarizing said another dielectric deposition and the dielectric layer until the top surface of the pattern of dummy nitrides is exposed, wherein the pattern of dummy nitrides is disposed correspondingly to a position between the plurality of polysilicon gates and the top surface of the CESL above the plurality of polysilicon gates.

9. The method according to claim 8, after planarizing said another dielectric deposition and the dielectric layer, the method further comprising:
removing the pattern of dummy nitrides and a top portion of the CESL above the plurality of polysilicon gates to expose the plurality of polysilicon gates; and
replacing the plurality of polysilicon gates with metal gates.

10. The method according to claim 1, wherein the second area is an area with a density of polysilicon gates lower than a density of the plurality of polysilicon gates in the first area, or the second area is the area without any polysilicon gate.

11. The method according to claim 1, wherein the second area is a HV-region, and the pattern of dummy nitrides is formed above plural HV-polysilicon gates.

12. The method according to claim 1, wherein the dielectric layer is a single oxide layer.

13. The method according to claim 1, wherein the dielectric layer is a multi-layer comprising:
   a first oxide layer formed on the CESL;
   an underlying nitride layer formed on the first oxide layer; and
   a second oxide layer formed on the underlying nitride layer,
   wherein the nitride layer is formed on the second oxide layer of the multi-layer.

14. The method according to claim 13, after forming the pattern of dummy nitrides, the method further comprising:
   defining the multi-layer to form plural multi-layer stacks in the second area according to the pattern of dummy nitrides, wherein the nitride layer, the second oxide layer and the underlying nitride layer in the first area are completely removed.

15. The method according to claim 14, after defining the multi-layer, the method further comprising: forming another dielectric deposition on the dielectric layer to cover the pattern of dummy nitrides; planarizing said another dielectric deposition and the dielectric layer until a top surface of the pattern of dummy nitrides is exposed;
   removing the pattern of dummy nitrides and a top portion of the CESL above the plurality of polysilicon gates to expose the plurality of polysilicon gates; and replacing the plurality of polysilicon gates with metal gates, wherein a pattern of patterned underlying nitrides is formed in the second area, and the pattern of patterned underlying nitrides is substantially parallel to the substrate.

* * * * *